United States Patent
Lee et al.

(10) Patent No.: US 11,764,777 B2
(45) Date of Patent: Sep. 19, 2023

(54) CURRENT DRIVING CIRCUIT

(71) Applicant: DONGWOON ANATECH CO., LTD., Seoul (KR)

(72) Inventors: Joon Seok Lee, Seoul (KR); Yu Hwang Lee, Seoul (KR); Jin Park, Seoul (KR)

(73) Assignee: DONGWOON ANATECH CO., LTD., Seoul (KR)

( * ) Notice: Subject to any disclaimer, the term of this patent is extended or adjusted under 35 U.S.C. 154(b) by 1 day.

(21) Appl. No.: 17/630,751

(22) PCT Filed: Feb. 22, 2021

(86) PCT No.: PCT/KR2021/002167
§ 371 (c)(1),
(2) Date: Jan. 27, 2022

(87) PCT Pub. No.: WO2021/251590
PCT Pub. Date: Dec. 16, 2021

(65) Prior Publication Data
US 2022/0263504 A1 Aug. 18, 2022

(30) Foreign Application Priority Data

Jun. 10, 2020 (KR) .................. 10-2020-0070477

(51) Int. Cl.
*H03K 3/00* (2006.01)
*H03K 17/00* (2006.01)
(Continued)

(52) U.S. Cl.
CPC ............ *H03K 17/687* (2013.01); *H03M 1/66* (2013.01)

(58) Field of Classification Search
None
See application file for complete search history.

(56) References Cited

U.S. PATENT DOCUMENTS

| 7,598,800 B2* | 10/2009 | Thandi | ............... | G05F 3/205 |
| | | | | 327/540 |
| 7,969,253 B2* | 6/2011 | Shiah | ............... | H03K 3/0315 |
| | | | | 331/34 |

(Continued)

FOREIGN PATENT DOCUMENTS

| JP | 11-214183 A | 8/1999 |
| JP | WO2011/158786 A1 | 12/2011 |

(Continued)

*Primary Examiner* — Kenneth B Wells
(74) *Attorney, Agent, or Firm* — Birch, Stewart, Kolasch & Birch, LLP

(57) ABSTRACT

The present invention relates to a new type of current driving circuit, which has high linearity during low current driving, comprising: a voltage-current conversion unit for converting an input voltage into a current; a digital analog converter (DAC) connected to an output terminal of the voltage-current conversion unit and for generating and outputting a voltage corresponding to an applied digital code; a field effect transistor having a first electrode connected to a load and a second electrode connected to a node connected to a resistor, and for allowing a current to flow to the load in response to a voltage applied to a gate; an amplifier for receiving the voltage output from the digital analog converter and a voltage generated by the resistor, generating a voltage for controlling such that a current flows from the field effect transistor, and applying same to the gate; a current supply source for supplying to the first electrode a current required for operating the field effect transistor in a saturation region; and a control unit for controlling the field effect transistor to operate in the saturation region, by activating the current supply source, if the field effect transistor operates in a region lower than a threshold voltage.

3 Claims, 3 Drawing Sheets

(51) Int. Cl.
*H03K 17/687* (2006.01)
*H03M 1/66* (2006.01)

(56) References Cited

U.S. PATENT DOCUMENTS

| | | | | |
|---|---|---|---|---|
| 8,098,057 | B2* | 1/2012 | Morino | G05F 1/56 |
| | | | | 323/280 |
| 8,248,176 | B2* | 8/2012 | Takano | H03K 4/501 |
| | | | | 331/66 |
| 8,373,496 | B2* | 2/2013 | Cusinato | G05F 1/561 |
| | | | | 327/543 |
| 8,836,314 | B2* | 9/2014 | Zhu | G05F 1/561 |
| | | | | 323/315 |
| 8,907,573 | B2* | 12/2014 | Kraft | H05B 45/46 |
| | | | | 315/307 |
| 9,203,350 | B2* | 12/2015 | Dempsey | H03F 3/45475 |
| 9,239,584 | B2* | 1/2016 | Lerner | G05F 1/56 |
| 9,727,073 | B1* | 8/2017 | Voo | G05F 3/02 |
| 9,939,829 | B2* | 4/2018 | Bartalini | G05F 1/561 |
| 11,455,000 | B2* | 9/2022 | Ho | G05F 1/575 |
| 11,569,838 | B2* | 1/2023 | Tukel | H02M 1/0025 |
| 2010/0301932 | A1 | 12/2010 | Byon | |
| 2012/0154189 | A1 | 6/2012 | Cho et al. | |

FOREIGN PATENT DOCUMENTS

| | | |
|---|---|---|
| KR | 10-0572312 B1 | 4/2006 |
| KR | 10-2010-0129575 A | 12/2010 |
| KR | 10-2011-0017491 A | 2/2011 |
| KR | 10-1029181 B1 | 4/2011 |
| KR | 10-1705159 B1 | 2/2017 |
| KR | 10-2082320 B1 | 2/2020 |

* cited by examiner

CURRENT DRIVING CIRCUIT

CROSS REFERENCE TO RELATED APPLICATIONS

This application is the National Phase of PCT International Application No. PCT/KR2021/002167, filed on Feb. 22, 2021, which claims priority under 35 U.S.C. 119(a) to Patent Application No. 10-2020-0070477, filed in the Republic of Korea on Jun. 10, 2020, all of which are hereby expressly incorporated by reference into the present application.

TECHNICAL FIELD

The present invention relates to a current driving circuit, and more particularly, relates to a new type of current driving circuit having a high linearity characteristic when driving at low current.

BACKGROUND ART

The current driving method is a driving method widely used in AF drivers, backlight LED drivers, LED light drivers, white LED drivers, flash LED drivers, and various applications. Among the important specifications of such a current driving method, linearity is an important factor, which means that the driving output current must be first order linear with respect to a desired input digital code.

Such a linearity has poor characteristics in the case of very low current driving where the output current is close to zero, and the reason is that the current is too small, and the driving transistor operates in a weak state, that is, in a state that is almost turned off (below the threshold voltage), which leads to deterioration of characteristics.

More specifically, FIG. 1 shows a structure of a general current driving circuit, in which an output current is determined according to a digital code applied to a resistor D/A converter (RDAC) 30. When the output current is very small, the current driving transistor 50 operates in a linear region, and the feedback loop characteristic of the amplifier 40 is greatly degraded. In this case, the feedback loop gain of the driving unit decreases, resulting in a decrease in linearity. In particular, it has a noisy characteristic in which the output current fluctuates according to changes in external process, temperature, and power supply voltage, which acts as a fatal weakness of current driving.

PRIOR ART LITERATURE

Patent Literature (Patent Literature 1) Korean Patent Application Publication No. 10-2011-0017491

DETAILED DESCRIPTION OF THE INVENTION

Technical Solution

Accordingly, the present invention is devised to solve the above-mentioned problems, and a main object of the present invention is to provide a current driving circuit having high linear characteristics when driving at low current.

Further, another object of the present invention is to provide a current driving circuit having high linear characteristics so as not to be sensitive to external processes and environmental changes.

Technical Solution

A current driving circuit according to an embodiment of the present invention for achieving the above object comprises: a bandgap reference circuit; a voltage-to-current converter converting the voltage being outputted from the bandgap reference circuit into a current; a digital-to-analog converter (DAC) connected to an output terminal of the voltage-to-current converter to generate and output a voltage corresponding to an applied digital code; a field effect transistor in which a first electrode is connected to a load and a second electrode is connected to a node to which a resistor is connected so as to allow a current to flow in the load in response to a voltage applied to a gate terminal; and an amplifier that receives a voltage outputted from the digital-to-analog converter and a voltage formed across the resistor, respectively, to generate a voltage for switching and applying it to the gate terminal so that a current flows through the field effect transistor, and characterized by further including:
a current supply for supplying a current required for the field effect transistor to operate in a saturation region to the first electrode; and
a control unit configured to activate the current source to control the field effect transistor to operate in a saturation region when the field effect transistor operates in a region lower than a threshold voltage.

Furthermore, in the current driving circuit of the above configuration, another feature is that
the current supply is a digital-to-analog converter that includes power switching devices being connected between a plurality of switches that are switched according to an input digital code and a common power terminal, and each of the switches to supply current according to whether each switch is switched, and yet another feature is that
the control unit controls in a way that when the field effect transistor operates in a region lower than a threshold voltage, the digital-to-analog converter connected to an output terminal of the voltage-to-current converter outputs a minimum voltage set by restriction.

Advantageous Effects

According to the above-described technical problem solving means, a current driving circuit according to an embodiment of the present invention can not only secure high linear characteristics even when the output current is driven at a low current close to '0', but also has an advantage of having high linearity characteristics that are not sensitive to external processes and environmental changes.

BEST MODE OF THE INVENTION

The following detailed description of the present invention refers to the accompanying drawings, which show by way of illustration a specific embodiment in which the present invention may be practiced, in order to clarify the objects, technical solutions and advantages of the present invention. These embodiments are described in detail so as to be sufficient enough for those skilled in the art in implementing the present invention.

In addition, throughout the description and claims, the word 'comprise' and variations thereof are not intended to exclude other technical features, additions, components or steps. Other objects, advantages and characteristics of the present invention will become apparent to a person skilled in the art in part from this description and in part from practice of the present invention. The following illustrations and drawings are provided by way of illustration and are not intended to limit the invention. Accordingly, the following detailed description is not intended to be taken in a limiting sense, and the scope of the present invention, if properly described, is limited only by the appended claims, along with all scope equivalent to those claimed.

In this specification, unless indicated otherwise or clearly contradicted by context, items referred to in the singular encompass the plural unless the context requires otherwise. In addition, in describing the present invention, if it is determined that a detailed description of a related known configuration or function may obscure the gist of the present invention, the detailed description thereof will be omitted.

Figure 1:
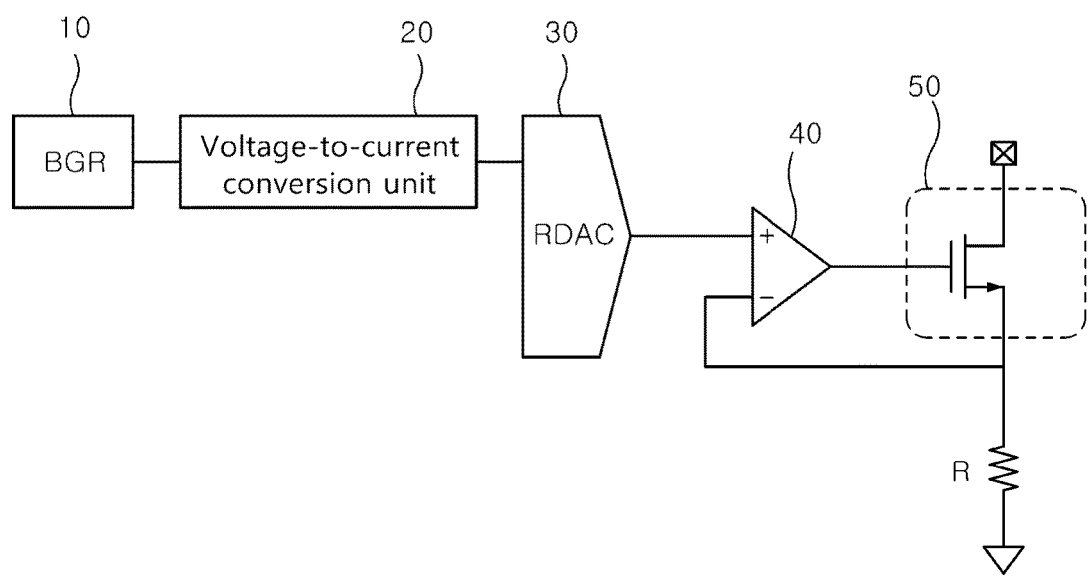
FIG. 1 is an exemplary view of a general current driving circuit.
Figure 2:
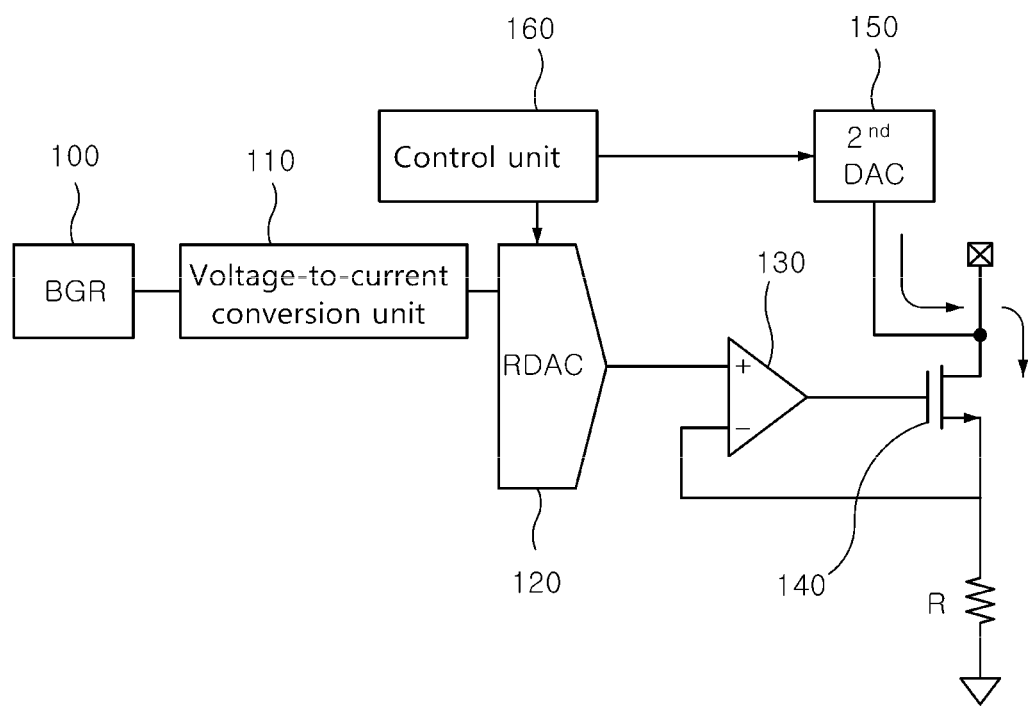
FIG. 2 is an exemplary view of a current driving circuit according to an embodiment of the present invention.
Figure 3:
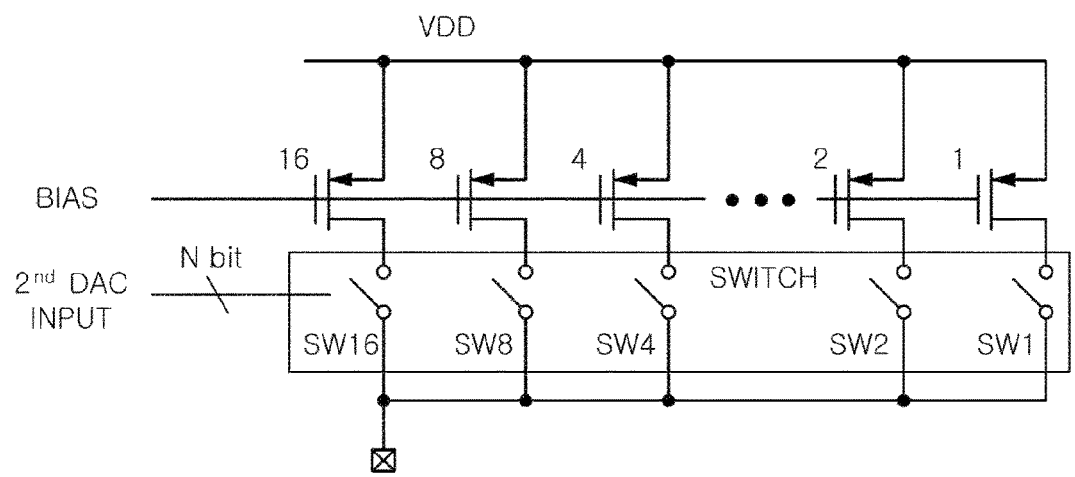
FIG. 3 is an exemplary circuit diagram of a second DAC illustrated in FIG. 2.

FIG. 2 is an exemplary view of a current driving circuit according to an embodiment of the present invention, and FIG. 3 is an exemplary circuit diagram of a $2^{nd}$ DAC 150 illustrated in FIG. 2.

First, as illustrated in FIG. 2, the current driving circuit according to the embodiment of the present invention comprises:
- a bandgap reference (BGR) circuit 100 for supplying a stable voltage;
- a voltage-to-current converter (Voltage to Current) 110 for converting a voltage input from the bandgap reference (BGR) circuit 100 into a current;
- a digital-to-analog converter 120 (Resistor DAC, RDAC) connected to the output terminal of the voltage-to-current converter 110 to generate and output a voltage corresponding to a digital code applied from a control unit 160 to be described later;
- a field effect transistor 140 in which a first electrode is connected to a load and a second electrode is connected to a node to which the resistor R is connected.

A first electrode of the field effect transistor 140 is a drain electrode, and a second electrode is a source electrode that controls a current flowing from the first electrode to the second electrode in response to a voltage applied to the gate terminal.

An amplifier 130 is connected to a gate terminal of the field effect transistor 140, in which a voltage being outputted from the digital-to-analog converter (RDAC) 120 and a voltage formed across the resistor R, are respectively received at a non-inverting terminal (+) and an inverting terminal (−) to generate a voltage for switching and applying it to the gate terminal so that a current flows through the field effect transistor 140.

For reference, the voltage being fed back to the inverting terminal (−) in a general current driving circuit including the above-described configurations is defined as the same voltage as a voltage being inputted to the non-inverting terminal (+).

Meanwhile, in addition to the above-described configuration, the current driving circuit according to an embodiment of the present invention further includes a current supply for supplying a current required for the field effect transistor 140 to operate in a saturation region to the first electrode.

The current source can be implemented with: a plurality of switches SW1, SW2, SW4, SW8, and SW16 which are switched according to the input digital code (n-bit inputted to $2^{nd}$ DAC) as illustrated in FIG. 3; and a digital-to-analog converter (DAC) 150 including power switching elements 1, 2, 4, 8, and 16 connected between the common power terminal VDD and each of the switches SW1, SW2, SW4, SW8, and SW16 to supply current according to whether each switch is switched. This digital-to-analog converter (DAC) 150 may be referred to as a $2^{nd}$ DAC in order to differentiate it from the RDAC 120 described previously.

The power switching elements 1, 2, 4, 8, and 16 of the $2^{nd}$ DAC 150 illustrated in FIG. 3 are binary weighted transistors, which are doubled in size, and may have a structure in which the resolution can also be changed according to the supplied current. This $2^{nd}$ DAC 150 supplies a desired current to the first electrode of the field effect transistor 140 corresponding to the current driving transistor according to a switch that is selectively switched on according to a digital code that is applied from the control unit 160 to be described later or is preset and activated.

In addition to the above-described current supply source, a current driving circuit according to an embodiment of the present invention is characterized by further including a control unit 160 that controls in a way that when the field effect transistor 140 operates in a sub-threshold region which is lower than a threshold voltage, the $2^{nd}$ DAC 150, which is the current source, is activated so that the field effect transistor 140 operates in a saturation region.

Another feature is that the control unit 160 controls the RDAC 120 to output a minimum voltage set by restriction when the field effect transistor 140 is operating in a region lower than a threshold voltage. It is preferable to interpret that the control unit 160 controls the output voltage of the RDAC 120 not to be lowered further when the field effect transistor 140 is operating in a region lower than the set threshold voltage.

Hereinafter, the operation of a current driving circuit according to an embodiment of the present invention will be described in more detail with reference to the accompanying drawings.

First, referring to FIG. 2, when the controller 160 applies an input of a digital code to the RDAC 120, an analog voltage corresponding thereto is applied to the final driver stage, that is, the gate terminal of the field effect transistor 140, thereby generating an output current.

When the output current is very small, the field effect transistor 140 operates in a linear region and operates in a region lower than a threshold voltage. In this case, the feedback loop characteristic of the amplifier 130 is degraded, and as a result, the feedback loop gain of the driving unit is lowered, thereby degrading the linearity.

In order to solve this problem, the control unit 160 of the current driving circuit according to the embodiment of the present invention maintains inactive state in a section other than a low current section where an output current is close to '0', to make sure that no current is supplied from the $2^{nd}$ DAC 150.

When an output current is close to '0', that is, when the field effect transistor 140 needs to operate in a region of a sub-threshold voltage lower than a threshold voltage, in order to prevent further lowering of the output of the RDAC 120 (limited to a minimum voltage set by restriction) and to prevent the field effect transistor 140 from operating in a linear region or a region lower than the threshold voltage, the control unit 160 supports activation of the $2^{nd}$ DAC 150 so that current is supplied to the source electrode.

That is, in the present invention, in a low current section where the output current of the current driving circuit is close to '0', the field effect transistor 140 can operate in the saturation region by trimming the current level applied to each of the gate terminal and the source electrode through the different DACs 120 and 150, so that the final output current may be outputted as low current without reducing the current applied to the field effect transistor 140.

Therefore, there are advantages in that a current driving circuit according to the embodiment of the present invention can ensure high linearity characteristics even when the output current is driven at a low current close to '0', and it is possible to design a current driving circuit (driver IC) with high linearity that is not sensitive to external process and environmental changes.

In addition, a current driving circuit according to an embodiment of the present invention has an advantage that it can be widely applied to a current driving method of a backlight LED driver, a white LED driver, a lighting LED driver, a flash LED driver, an autofocus (bidirectional open-loop AF, closed-loop AF) driver IC, and the like.

In the above, the present invention has been described with specific matters such as specific components and limited embodiments and drawings, but these are provided to help a more general understanding of the present invention, and the present invention is not limited to the above embodiments, and a person of ordinary skill in the art to which the present invention belongs can make various modifications and variations from these descriptions. For example, in an embodiment of the present invention, it has been described that a current of a set level is supplied to the source electrode by activating the $2^{nd}$ DAC 150, however, it can also be implemented as a method of applying an n-bit digital code capable of supplying the required current to the $2^{nd}$ DAC 150. Therefore, the spirit of the present invention should not be limited to the above-described embodiments, and it should be said that not only the claims being described hereinafter, but also all equivalents or equivalent modifications of the claims fall within the scope of the spirit of the present invention.

The invention claimed is:

1. A current driving circuit comprising:
    a voltage-to-current converter converting an input voltage into a current;
    a digital-to-analog converter (DAC) connected to an output terminal of the voltage-to-current converter to generate and output a voltage corresponding to an applied input digital code;
    a field effect transistor in which a first electrode is connected to a load and a second electrode is connected to a node to which a resistor is connected so as to allow a current to flow in the load in response to a voltage applied to a gate terminal;
    an amplifier that receives a voltage outputted from the digital-to-analog converter and a voltage formed across the resistor, respectively, to generate a voltage for switching and applying it to the gate terminal so that a current flows through the field effect transistor;
    a current supply for supplying a current required for the field effect transistor to operate in a saturation region to the first electrode; and
    a control unit that controls in a way that when the field effect transistor operates in a region lower than a threshold voltage, the current source is activated so that the field effect transistor operates in the saturation region.

2. The current driving circuit according to claim 1, characterized in that the current supply includes:
    a plurality of switches that are switched according to the input digital code and;
    a digital-to-analog converter that includes power switching devices being connected between the plurality of switches that are switched according to the input digital code and a common power terminal, and each of the switches to supply a current according to whether each switch is switched.

3. The current driving circuit according to claim 1, characterized in that the control unit controls in a way that when the field effect transistor operates in a region lower than the threshold voltage, the digital-to-analog converter outputs a predetermined minimum voltage.

* * * * *